United States Patent
McCann et al.

(10) Patent No.: US 7,064,009 B1
(45) Date of Patent: Jun. 20, 2006

(54) THERMALLY ENHANCED CHIP SCALE LEAD ON CHIP SEMICONDUCTOR PACKAGE AND METHOD OF MAKING SAME

(75) Inventors: David R. McCann, Chandler, AZ (US); Richard L. Groover, Chandler, AZ (US); Paul R. Hoffman, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 194 days.

(21) Appl. No.: 11/018,731

(22) Filed: Dec. 21, 2004

Related U.S. Application Data (60) Division of application No. 10/610,016, filed on Jun. 30, 2003, now Pat. No. 6,873,032, which is a continuation of application No. 09/825,785, filed on Apr. 4, 2001, now Pat. No. 6,597,059.

(51) Int. Cl.
*H01L 21/44* (2006.01)

(52) U.S. Cl. .................. 438/112; 438/123

(58) Field of Classification Search ............ 438/112, 438/123, 106, 111; 257/666, 720, 778, 690, 257/673
See application file for complete search history.

(56) References Cited

U.S. PATENT DOCUMENTS

| | | |
|---|---|---|
| 2,596,993 A | 5/1952 | Gookin |
| 3,435,815 A | 4/1969 | Forcier |
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |

(Continued)

FOREIGN PATENT DOCUMENTS

| | | |
|---|---|---|
| DE | 19734794 A1 | 8/1997 |

(Continued)

OTHER PUBLICATIONS

National Semiconductor Corporation, "Leadless Leadframe Package," Informational Pamphlet from webpage, 21 pages, Oct. 2002, www.national.com.

*Primary Examiner*—Douglas W. Owens
(74) *Attorney, Agent, or Firm*—Stetina Brunda Garred & Brucker (57) ABSTRACT

A thermally enhanced, chip-scale, Lead-on-Chip ("LOC") semiconductor package includes a substrate having a plurality of metal lead fingers in it. A semiconductor chip having an active surface with a plurality of ground, power, and signal connection pads thereon is mounted on an upper surface of the substrate in a flip-chip electrical connection with the lead fingers. A plurality of the ground and/or the power connection pads on the chip are located in a central region thereof. Corresponding metal grounding and/or power lands are formed in the substrate at positions corresponding to the centrally located ground and/or power pads on the chip. The ground and power pads on the chip are connected to corresponding ones of the grounding and power lands in the substrate in a flip-chip connection, and a lower surface of the lands is exposed to the environment through a lower surface of the semiconductor package for connection to an external heat sink. The lands can be connected to selected ones of the lead fingers, and/or combined with one another for even greater thermal and electrical conductivity.

17 Claims, 3 Drawing Sheets

U.S. PATENT DOCUMENTS

| | | |
|---|---|---|
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |

| | | | | | | |
|---|---|---|---|---|---|---|
| 5,903,049 | A | 5/1999 | Mori | 6,282,095 | B1 | 8/2001 | Houghton et al. |
| 5,903,050 | A | 5/1999 | Thurairajaratnam et al. | 6,285,075 | B1 | 9/2001 | Combs et al. |
| 5,909,053 | A | 6/1999 | Fukase et al. | 6,291,271 | B1 | 9/2001 | Lee et al. |
| 5,915,998 | A | 6/1999 | Stidham et al. | 6,291,273 | B1 | 9/2001 | Miyaki et al. |
| 5,917,242 | A | 6/1999 | Ball | 6,294,100 | B1 | 9/2001 | Fan et al. |
| 5,939,779 | A | 8/1999 | Kim | 6,294,830 | B1 | 9/2001 | Fjelstad |
| 5,942,794 | A | 8/1999 | Okumura et al. | 6,295,977 | B1 | 10/2001 | Ripper et al. |
| 5,951,305 | A | 9/1999 | Haba | 6,297,548 | B1 | 10/2001 | Moden et al. |
| 5,959,356 | A | 9/1999 | Oh | 6,303,984 | B1 | 10/2001 | Corisis |
| 5,969,426 | A | 10/1999 | Baba et al. | 6,303,997 | B1 | 10/2001 | Lee |
| 5,973,388 | A | 10/1999 | Chew et al. | 6,307,272 | B1 | 10/2001 | Takahashi et al. |
| 5,976,912 | A | 11/1999 | Fukutomi et al. | 6,309,909 | B1 | 10/2001 | Ohgiyama |
| 5,977,613 | A | 11/1999 | Takata et al. | 6,316,822 | B1 | 11/2001 | Venkateshwaran et al. |
| 5,977,615 | A | 11/1999 | Yamaguchi et al. | 6,316,838 | B1 | 11/2001 | Ozawa et al. |
| 5,977,630 | A | 11/1999 | Woodworth et al. | 6,323,550 | B1 | 11/2001 | Martin et al. |
| 5,981,314 | A | 11/1999 | Glenn et al. | 6,326,243 | B1 | 12/2001 | Suzuya et al. |
| 5,986,333 | A | 11/1999 | Nakamura | 6,326,244 | B1 | 12/2001 | Brooks et al. |
| 5,986,885 | A | 11/1999 | Wyland | 6,326,678 | B1 | 12/2001 | Karnezos et al. |
| 6,001,671 | A | 12/1999 | Fjelstad | 6,335,564 | B1 | 1/2002 | Pour |
| 6,013,947 | A | 1/2000 | Lim | 6,337,510 | B1 | 1/2002 | Chun-Jen et al. |
| 6,018,189 | A | 1/2000 | Mizuno | 6,339,255 | B1 | 1/2002 | Shin |
| 6,020,625 | A | 2/2000 | Qin et al. | 6,348,726 | B1 | 2/2002 | Bayan et al. |
| 6,025,640 | A | 2/2000 | Yagi et al. | 6,355,502 | B1 | 3/2002 | Kang et al. |
| 6,031,279 | A | 2/2000 | Lenz | 6,369,447 | B1 | 4/2002 | Mori |
| 6,034,423 | A | 3/2000 | Mostafazadeh et al. | 6,369,454 | B1 | 4/2002 | Chung |
| 6,040,626 | A | 3/2000 | Cheah et al. | 6,373,127 | B1 | 4/2002 | Baudouin et al. |
| 6,043,430 | A | 3/2000 | Chun | 6,380,048 | B1 | 4/2002 | Boon et al. |
| 6,060,768 | A | 5/2000 | Hayashida et al. | 6,384,472 | B1 | 5/2002 | Huang |
| 6,060,769 | A | 5/2000 | Wark | 6,388,336 | B1 | 5/2002 | Venkateshwaran et al. |
| 6,072,228 | A | 6/2000 | Hinkle et al. | 6,395,578 | B1 | 5/2002 | Shin et al. |
| 6,075,284 | A | 6/2000 | Choi et al. | 6,400,004 | B1 | 6/2002 | Fan et al. |
| 6,081,029 | A | 6/2000 | Yamaguchi | 6,410,979 | B1 | 6/2002 | Abe |
| 6,084,310 | A | 7/2000 | Mizuno et al. | 6,414,385 | B1 | 7/2002 | Huang et al. |
| 6,087,715 | A | 7/2000 | Sawada et al. | 6,420,779 | B1 | 7/2002 | Sharma et al. |
| 6,087,722 | A | 7/2000 | Lee et al. | 6,429,508 | B1 | 8/2002 | Gang |
| 6,100,594 | A | 8/2000 | Fukui et al. | 6,437,429 | B1 | 8/2002 | Su et al. |
| 6,113,474 | A | 9/2000 | Shih et al. | 6,444,499 | B1 | 9/2002 | Swiss et al. |
| 6,114,752 | A | 9/2000 | Huang et al. | 6,448,633 | B1 | 9/2002 | Yee et al. |
| 6,118,174 | A | 9/2000 | Kim | 6,452,279 | B1 | 9/2002 | Shimoda |
| 6,118,184 | A | 9/2000 | Ishio et al. | 6,459,148 | B1 | 10/2002 | Chun-Jen et al. |
| 6,130,115 | A | 10/2000 | Okumura et al. | 6,464,121 | B1 | 10/2002 | Reijnders |
| 6,130,473 | A | 10/2000 | Mostafazadeh et al. | 6,476,469 | B1 | 11/2002 | Huang et al. |
| 6,133,623 | A | 10/2000 | Otsuki et al. | 6,476,474 | B1 | 11/2002 | Hung |
| 6,140,154 | A | 10/2000 | Hinkle et al. | 6,482,680 | B1 | 11/2002 | Khor et al. |
| 6,143,981 | A | 11/2000 | Glenn | 6,498,099 | B1 | 12/2002 | McLellan et al. |
| 6,169,329 | B1 | 1/2001 | Farnworth et al. | 6,498,392 | B1 | 12/2002 | Azuma |
| 6,177,718 | B1 | 1/2001 | Kozono | 6,507,096 | B1 | 1/2003 | Gang |
| 6,181,002 | B1 | 1/2001 | Juso et al. | 6,507,120 | B1 | 1/2003 | Lo et al. |
| 6,184,465 | B1 | 2/2001 | Corisis | 6,534,849 | B1 | 3/2003 | Gang |
| 6,184,573 | B1 | 2/2001 | Pu | 6,545,332 | B1 | 4/2003 | Huang |
| 6,194,777 | B1 | 2/2001 | Abbott et al. | 6,545,345 | B1 | 4/2003 | Glenn et al. |
| 6,197,615 | B1 | 3/2001 | Song et al. | 6,559,525 | B1 | 5/2003 | Huang |
| 6,198,171 | B1 | 3/2001 | Huang et al. | 6,566,168 | B1 | 5/2003 | Gang |
| 6,201,186 | B1 | 3/2001 | Daniels et al. | 6,583,503 | B1 | 6/2003 | Akram et al. |
| 6,201,292 | B1 | 3/2001 | Yagi et al. | 6,603,196 | B1 | 8/2003 | Lee et al. |
| 6,204,554 | B1 | 3/2001 | Ewer et al. | 6,624,005 | B1 | 9/2003 | Di Caprio et al. |
| 6,208,020 | B1 | 3/2001 | Minamio et al. | 6,667,546 | B1 | 12/2003 | Huang et al. |
| 6,208,021 | B1 | 3/2001 | Ohuchi et al. | 2001/0008305 | A1 | 7/2001 | McLellan et al. |
| 6,208,023 | B1 | 3/2001 | Nakayama et al. | 2001/0014538 | A1 | 8/2001 | Kwan et al. |
| 6,211,462 | B1 | 4/2001 | Carter, Jr. et al. | 2002/0011654 | A1 | 1/2002 | Kimura |
| 6,218,731 | B1 | 4/2001 | Huang et al. | 2002/0024122 | A1 | 2/2002 | Jung et al. |
| 6,222,258 | B1 | 4/2001 | Asano et al. | 2002/0027297 | A1 | 3/2002 | Ikenaga et al. |
| 6,222,259 | B1 | 4/2001 | Park et al. | 2002/0140061 | A1 | 10/2002 | Lee |
| 6,225,146 | B1 | 5/2001 | Yamaguchi et al. | 2002/0140068 | A1 | 10/2002 | Lee et al. |
| 6,229,200 | B1 | 5/2001 | Mclellan et al. | 2002/0163015 | A1 | 11/2002 | Lee et al. |
| 6,229,205 | B1 | 5/2001 | Jeong et al. | 2003/0030131 | A1 | 2/2003 | Lee et al. |
| 6,239,367 | B1 | 5/2001 | Hsuan et al. | 2003/0073265 | A1 | 4/2003 | Hu et al. |
| 6,239,384 | B1 | 5/2001 | Smith et al. | 2004/0056277 | A1 | 3/2004 | Karnezos |
| 6,242,281 | B1 | 6/2001 | Mclellan et al. | 2004/0061212 | A1 | 4/2004 | Karnezos |
| 6,256,200 | B1 | 7/2001 | Lam et al. | 2004/0061213 | A1 | 4/2004 | Karnezos |
| 6,258,629 | B1 | 7/2001 | Niones et al. | 2004/0063242 | A1 | 4/2004 | Karnezos |
| 6,281,566 | B1 | 8/2001 | Magni | 2004/0063246 | A1 | 4/2004 | Karnezos |
| 6,281,568 | B1 | 8/2001 | Glenn et al. | 2004/0065963 | A1 | 4/2004 | Karnezos |

FOREIGN PATENT DOCUMENTS

| | | |
|---|---|---|
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |
| EP | 0989608 | 3/2000 |
| EP | 1032037 | 8/2000 |
| JP | 55163868 | 12/1980 |
| JP | 5745959 | 3/1982 |
| JP | 58160096 | 8/1983 |
| JP | 59208756 | 11/1984 |
| JP | 59227143 | 12/1984 |
| JP | 60010756 | 1/1985 |
| JP | 60116239 | 8/1985 |
| JP | 60195957 | 10/1985 |
| JP | 60231349 | 11/1985 |
| JP | 6139555 | 2/1986 |
| JP | 629639 | 1/1987 |
| JP | 6333854 | 2/1988 |
| JP | 63067762 | 3/1988 |
| JP | 63188964 | 8/1988 |
| JP | 63205935 | 8/1988 |
| JP | 63233555 | 9/1988 |
| JP | 63249345 | 10/1988 |
| JP | 63289951 | 11/1988 |
| JP | 63316470 | 12/1988 |
| JP | 64054749 | 3/1989 |
| JP | 1106456 | 4/1989 |
| JP | 1175250 | 7/1989 |
| JP | 1205544 | 8/1989 |
| JP | 1251747 | 10/1989 |
| JP | 2129948 | 5/1990 |
| JP | 369248 | 7/1991 |
| JP | 3177060 | 8/1991 |
| JP | 4098864 | 9/1992 |
| JP | 5129473 | 5/1993 |
| JP | 5166992 | 7/1993 |
| JP | 5283460 | 10/1993 |
| JP | 692076 | 4/1994 |
| JP | 6140563 | 5/1994 |
| JP | 6260532 | 9/1994 |
| JP | 7297344 | 11/1995 |
| JP | 7312405 | 11/1995 |
| JP | 864634 | 3/1996 |
| JP | 8083877 | 3/1996 |
| JP | 8125066 | 5/1996 |
| JP | 96-4284 | 6/1996 |
| JP | 8222682 | 8/1996 |
| JP | 8306853 | 11/1996 |
| JP | 98205 | 1/1997 |
| JP | 98206 | 1/1997 |
| JP | 98207 | 1/1997 |
| JP | 992775 | 4/1997 |
| JP | 9293822 | 11/1997 |
| JP | 10022447 | 1/1998 |
| JP | 10163401 | 6/1998 |
| JP | 10199934 | 7/1998 |
| JP | 10256240 | 9/1998 |
| JP | 00150765 | 5/2000 |
| JP | 556398 | 10/2000 |
| JP | 2001060648 | 3/2001 |
| JP | 2002043497 | 8/2002 |
| KR | 941979 | 1/1994 |
| KR | 9772358 | 11/1997 |
| KR | 100220154 | 6/1999 |
| KR | 0049944 | 6/2002 |
| WO | 9956316 | 11/1999 |
| WO | 9967821 | 12/1999 |

THERMALLY ENHANCED CHIP SCALE LEAD ON CHIP SEMICONDUCTOR PACKAGE AND METHOD OF MAKING SAME

RELATED APPLICATIONS

The present application is a divisional of U.S. application Ser. No. 10/610,016 entitled THERMALLY ENHANCED CHIP SCALE LEAD ON CHIP SEMICONDUCTOR PACKAGE AND METHOD OF MAKING SAME filed Jun. 30, 2003, now U.S. Pat. No. 6,873,032 which is a continuation of U.S. application Ser. No. 09/825,785 entitled THERMALLY ENHANCED CHIP SCALE LEAD ON CHIP SEMICONDUCTOR PACKAGE filed Apr. 4, 2001 and issued as U.S. Pat. No. 6,597,059 on Jul. 22, 2003.

BACKGROUND

1. Technical Field

This invention relates to semiconductor packaging in general, and in particular, to making low-cost, thermally enhanced, chip-scale, lead-on-chip semiconductor packages.

2. Related Art

In a well-known type of semiconductor package, the back surface of a semiconductor die, or "chip," is mounted on a metal die-attach pad contained in a substrate, e.g., a leadframe or a laminate, and surrounded by a plurality of metal leads contained therein. A plurality of fine, conductive wires are bonded between metal pads on an "active," front surface of the chip and the metal leads in the substrate to electrically interconnect the chip and substrate. The die, wire bonds, and portions of the substrate are then encapsulated in a protective plastic body.

The metal die-attach pad in the substrate gives the package relatively good thermal performance. However, the wire bonds between the chip and the substrate result in a relatively large package size. In an effort to reduce package size, so-called "Lead-On-Chip" ("LOC") packages were developed in which the leads of a leadframe substrate are attached to the active, upper surface of the chip and wire bonded to the pads thereon with very short wire bonds, such as described by R. P. Pashby, et al., in U.S. Pat. No. 4,862,245.

Later variations on this LOC technique include, a direct attachment between the pads on the chip and the leads in a Tape Automated Bonding ("TAB") tape substrate, as described by K. Michii in U.S. Pat. No. 5,252,853; a "flip-chip" attachment between the pads on the chip and the leads in a metal leadframe substrate, as described by J. M. Wark in U.S. Pat. No. 5,817,540; and, a combination of short wire bonds and a flip-chip attachment between the chip pads and the leads of a leadframe substrate, as described by M. B. Ball in U.S. Pat. No. 5,917,242.

While the foregoing LOC packages achieve some reduction in package size due to the reduced size of the electrical connections between the die and the substrate, they do so at the expense of the thermal performance of the package, relative to the above packages in which the back side of the chip is attached to a metal die-attach pad in the substrate. Efforts to address this latter problem in LOC packages include etching thermal "vias," i.e., openings, in the back side of the chips, or attaching a heat sink to the back side of the chip, as described by, e.g., C. P. Wyland in U.S. Pat. No. 5,986,885. However, these latter measures can largely offset the benefit of a reduced package size afforded by an LOC design, and in any case, add cost to the package.

SUMMARY

This invention provides a low-cost, thermally enhanced, chip-scale, LOC semiconductor package, and a method for making it. The novel package includes a substrate with a plurality of metal lead fingers in it, and a semiconductor chip having an active surface with a plurality of ground, power, and signal connection pads thereon. The active surface of the chip is mounted on an upper surface of the substrate with the ground, power, and signal pads in a flip-chip electrical connection with corresponding ones of the lead fingers in the substrate.

The novel method includes locating at least two of the ground or the power connection pads on the chip in a central region thereof, where the operating temperature in the chip is the greatest. Corresponding metal lands are formed in the substrate at positions corresponding to the positions of the ground or the power pads on the chip, and are connected to the corresponding ground or power pads in the chip in a flip-chip electrical connection. The lower surfaces of the corresponding lands in the substrate are exposed to the environment through a lower surface of the package for attachment by, e.g., soldering, to an external heat sink, e.g., a heavy grounding or power pad on a mother board.

Advantageously, the corresponding lands in the substrate can be formed on or otherwise connected to selected ones of the lead fingers, viz., grounding or power fingers, and/or can be combined with each other into a single, large grounding or power land in the substrate to provide even greater thermal and electrical conductivity. The substrate can comprise a patterned metal layer laminated on a dielectric layer, e.g., a flexible tape or a fiberglass-epoxy resin composite, in which the lower surface of the lands are exposed through openings formed through a lower surface of the dielectric layer at positions corresponding to the positions of the lands.

Alternatively, the substrate can comprise a "micro-leadframe" ("MLF") with a dielectric plastic body molded over it such that the lower surfaces of the grounding or power lands are exposed through, and optionally, flush with, a lower surface of the plastic body. The MLF can be made by forming a pattern of an etch-resistant material corresponding to the lead fingers and lands on a metal, then etching the desired pattern. In packages in which the desired spacing between the lead fingers and the lands is less than the thickness of the metal, the etching process may involve etching about half way through the metal, forming a second pattern of etch-resistant material on the half-etched portions of the metal, and then etching to produce the desired pattern.

The large, centrally located grounding or power lands in the substrate of the invention provide enhanced thermal and electrical connectivity between the chip and the external environment, thereby enabling a low-profile, flip-chip electrical connection method to be used in the package, and eliminating the need for a die-attach pad in the substrate, back-side thermal vias in the chip, or a heat sink on the back side of the chip, and accordingly, the invention is particularly well suited to the low-cost packaging of, among other types of devices, Thin Standard Outline Package ("TSOP") Dynamic Random Access Memory ("DRAM") devices.

DESCRIPTION OF THE FIGURES OF THE DRAWINGS

A better understanding of the above and other features and advantages of the present invention may be obtained from a perusal of the Detailed Description below of some exemplary embodiments thereof, particularly if such perusal is made in conjunction with the figures of the appended drawings, in which.

DETAILED DESCRIPTION

Figure 1:
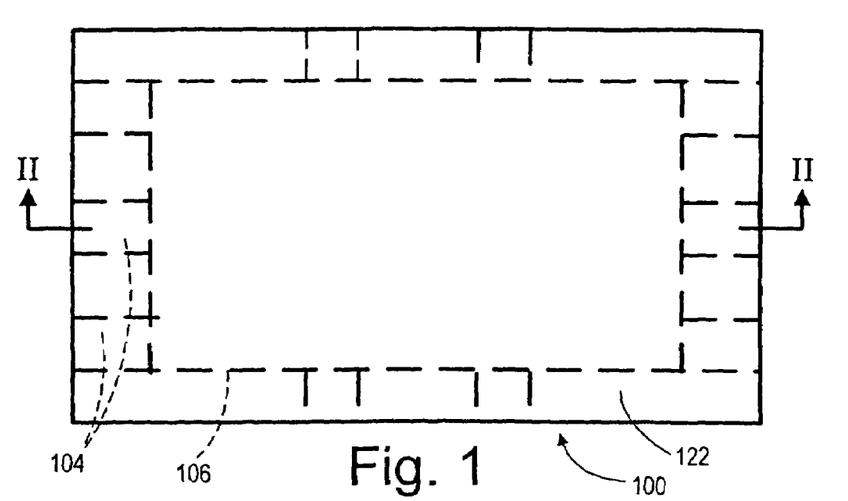
FIG. 1 is a top plan view of one exemplary embodiment of a thermally enhanced, chip-scale, lead-on-chip semiconductor package in accordance with this invention.
Figure 2:
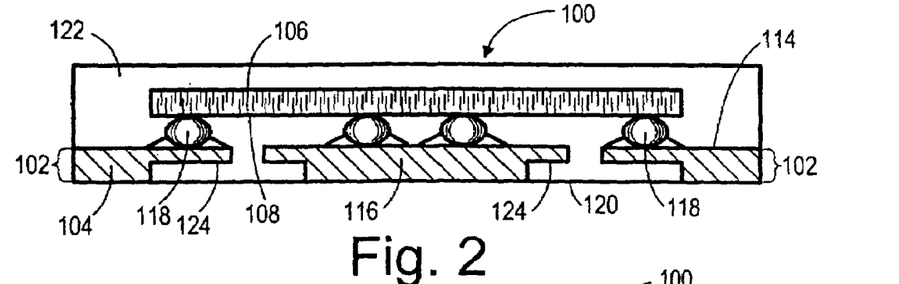
FIG. 2 is a cross-sectional side elevation view of the novel package shown in FIG. 1, as revealed by the section taken therein along the lines II—II.
Figure 3:
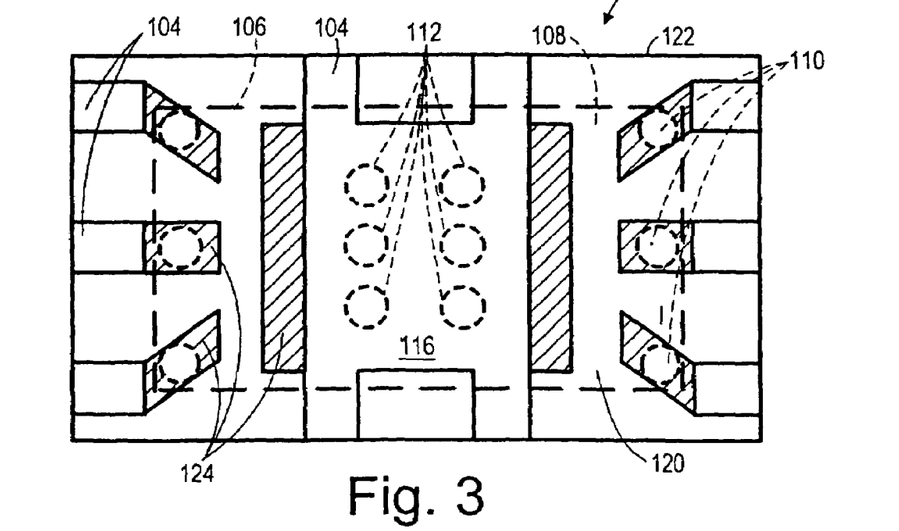
FIG. 3 is a bottom plan view of the package shown in FIGS. 1 and 2.

A first exemplary embodiment of a low-cost, thermally enhanced, chip-scale, LOC semiconductor package 100 in accordance with the present invention is illustrated in the top plan, cross-sectional side elevation, and bottom plan views of FIGS. 1–3, respectively. The novel package 100 includes a substrate 102 having a plurality of metal lead fingers 104 in it, and a semiconductor chip 106 having an active surface 108 with a plurality of signal connection pads 110, and a plurality of ground ("$V_{ss}$") and power ("$V_{cc}$") connection pads 1112, located thereon. The active surface 108 of the chip 106 is mounted on and in opposition to an upper surface 114 of the substrate 102, with the connection pads 110 and 112 connected in a "flip-chip" electrical connection with the lead fingers 104, or grounding or power "lands" 116 in the substrate, in the manner described below.

The "flip-chip" method of attaching chips to and in electrical connection with substrates was developed by IBM, Inc., in about 1965. Sometimes referred to as the "Controlled Collapse Chip Connection," or "C4," method (see, e.g., L. F. Miller, "Controlled Collapse Reflow Chip Joining," IBM J. Res. Develop., 239–250 (May 1969)), the technique involves forming balls or bumps of a metal, e.g., solder or gold, on connection pads on the active surface of a chip, then inverting, or "flipping" the chip upside-down, and fusing the conductive balls to corresponding ones of the lead fingers or connection pads on the upper surface of a substrate, typically in a conveyor oven.

Of importance in this invention, a plurality of the ground and/or power connection pads 112 on the chip 106 are located adjacent to each other in a central region of the active surface 108 of the chip. In the particular embodiment 100 illustrated in FIGS. 1–3, six ground and/or power connection pads 112 are shown located adjacent to each other in the central region of the chip 106. The connection pads 112 can be all ground pads, all power pads, or a mixture of the two types, and where a mixture of the two types is present, it is preferable that respective ones of the two types of pads be located adjacent to each other, for the reasons discussed below.

The ground or power connection pads 112 are advantageously located in the central region of the chip 106 because, during typical, steady-state operation thereof, the chip experiences a temperature gradient that is a maximum at the central region of the chip, and that decreases to a minimum at the peripheral, edge region of the chip, and accordingly, the central region of the chip requires a wider thermal path to the ambient than does the peripheral region for effective heat transfer from the package 100.

The ground or power pads 112 can be located in the central region of the chip 106 by express design during the layout of the "native" ground or power terminals of the integrated circuits comprised in the chip, or alternatively, the native device ground or power terminals in the chip can be re-located, or "re-mapped," on the chip surface after device layout and before chip fabrication using a variety of known techniques, including photo-etching, passivating, and metal plating techniques.

Also of importance, a plurality of corresponding metal grounding or power lands 116 are formed in the substrate 102 at positions corresponding to those of respective ones of the centrally located ground or power connection pads 112 on the chip 106. Where possible, it is desirable to combine respective ones of the grounding or power lands 116 in the substrate 102 into one or more larger lands, such as the single, large grounding or power land 116 underlying the six ground or power conniection pads 112 on the chip 106 shown in FIG. 3, and to form them on, or otherwise connect them to, selected ones of the lead fingers 104 in the substrate, namely, the corresponding grounding or power lead fingers of the substrate. In both instances, the object is to maximize the area of the land(s) 1116, and hence, the width of the thermal path between the chip 106 and the package environment.

Figure 7:
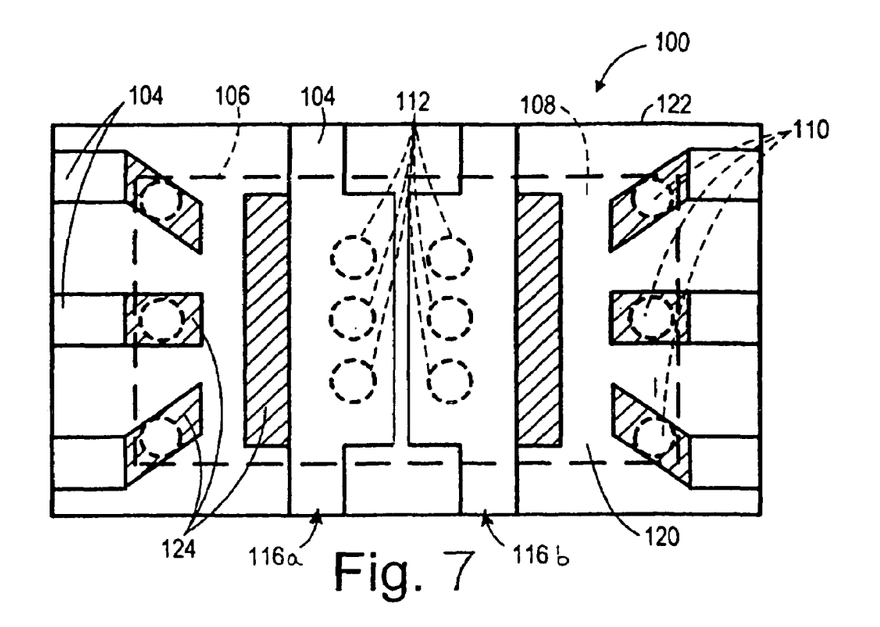
FIG. 7 is a bottom plan view of a split land version of the package shown in FIGS. 1–3.

If both ground and power types of connection pads 112 are located in the central region of the chip 106, then it is necessary to isolate the corresponding grounding and power lands 116 from each other electrically, thereby giving rise to two large, separate lands 116a, 116b corresponding to respective ones of the grounding and the power pads 112 on the chip 106, i.e., a "split land" configuration as shown in FIG. 7. It is therefore desirable to locate the ground and power pads 112 on the chip 106 respectively adjacent to each other so that the respective areas of the corresponding lands 116a, 116b can be made as large as possible.

The ground and power connection pads 112 on the chip 106 are electrically connected to corresponding ones of the grounding and power lands 116 in the substrate 102, and simultaneously, the signal connection pads 110 on the chip are electrically connected to corresponding ones of the lead fingers 104 therein, using the flip-chip connection method described above and a plurality of electrically and thermally conductive bumps 118, as shown in the cross-sectional side elevation view of FIG. 3. For enhanced thermal and electrical conductivity, the conductive bumps 118 can comprise gold or silver bumps.

A lower surface of the lead fingers 104 and the lands 116 in the substrate 102 are exposed through a lower surface 120 of the package 100 for thermal and electrical connection to corresponding mounting pads in the environment, e.g., a large grounding or power boss or pad on a mother board (not illustrated) to which the package 100 is mounted. The large land(s) 116 located directly below the relatively high-temperature central region of the chip 106 may thus be seen to constitute a wide, direct thermal path between the chip and the environment that effectively replaces the die-attach pad of the wire bonded packages of the prior art described above in a substantially lower-profile package.

After the chip 106 is mounted and connected to the substrate 102 as described above, a protective dielectric plastic body 122, e.g., a filled epoxy resin, is conventionally molded over the chip and portions of the substrate to protect them from environmental agents, particularly moisture.

In one possible laminate-type substrate embodiment of the package 100, the lead fingers 104 and the lands 116 of the substrate 102 can be patterned in a metal layer, e.g., a copper or an aluminum alloy, laminated on a dielectric layer, e.g., a flexible resin tape, such as a polyimide resin tape, or a fiberglass-epoxy resin composite, of a known type. In such an embodiment, selected portions of the lower surfaces of the lead fingers 104 and land(s) 116 can be exposed through the lower surface 120 of the package 100 by forming openings through a lower surface of the dielectric layer at positions corresponding to the lead fingers and lands, e.g., with a laser.

In another possible "micro-leadframe" ("MLF") embodiment of the package 100, the MLF can be made by forming a pattern of an etch-resistant material corresponding to the lead fingers 104 and the lands 116 on a metal, then etching the metal. In such an embodiment, the lead fingers 104 may comprise "tie-bars" that connect the lead fingers and grounding pads 116 to a surrounding support frame (not illustrated) that is cut away and discarded after package assembly. The tie-bars may be attached to the support frame at the corners and/or the sides thereof.

In packages 100 in which the spacing between adjacent ones of the lead fingers 104 and the grounding pads 116 is less than the thickness of the metal, the etching process may advantageously include etching about half way through the thickness of the metal in a first etching step, forming a second pattern of etch-resistant material on selected, half-etched portions of the metal, and then etching through the remaining thickness of the metal in a second etching step. Such a two-step etching process produces a characteristic reduction in the thickness 124 (shown cross-hatched in the figures) of portions of the lead fingers 104 and lands 116 that enables such portions to be precisely spaced at distances that are less than the thickness of the metal.

In such an MLF embodiment of the package 100, the protective plastic body 122 can be molded over both the upper and lower surfaces of the MLF such that selected portions of the lower surfaces of the lead fingers 104 and lands 116 are exposed through, and optionally, flush with, a lower surface 120 of the plastic body to define electrical and thermal mounting lands thereon.

Figure 4:
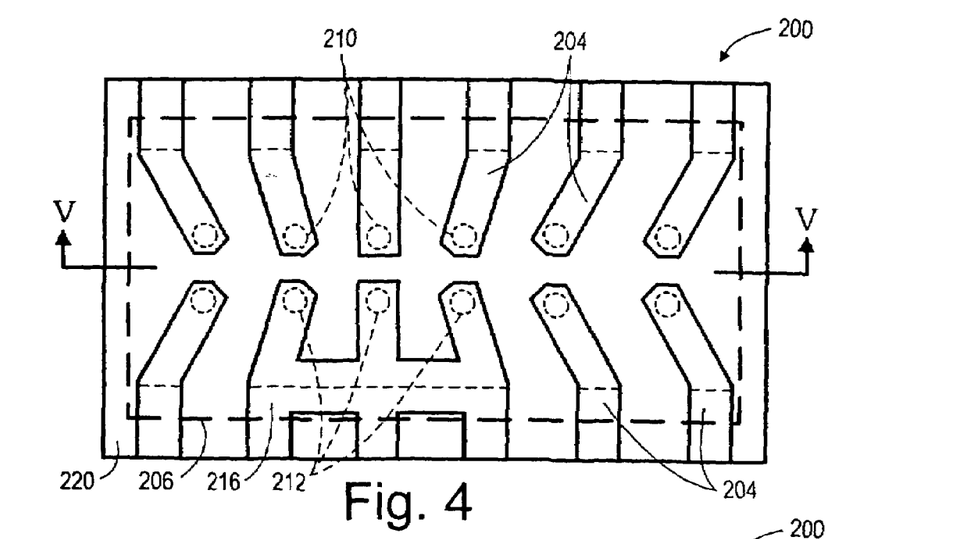
FIG. 4 is a top plan view of another exemplary embodiment of a thermally enhanced, chip-scale, lead-on-chip semiconductor package in accordance with this invention.
Figure 5:
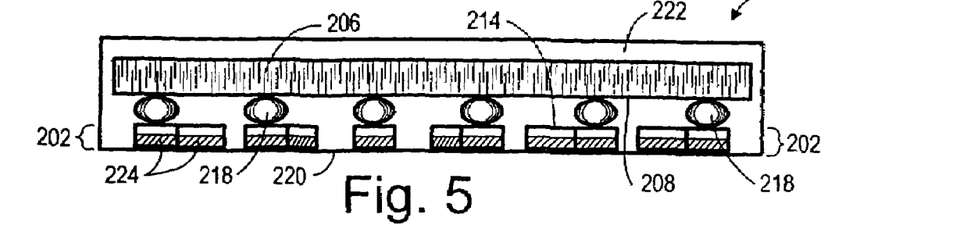
FIG. 5 is a cross-sectional side elevation view of the novel package shown in FIG. 4, as revealed by the section taken therein along lines V—V.
Figure 6:
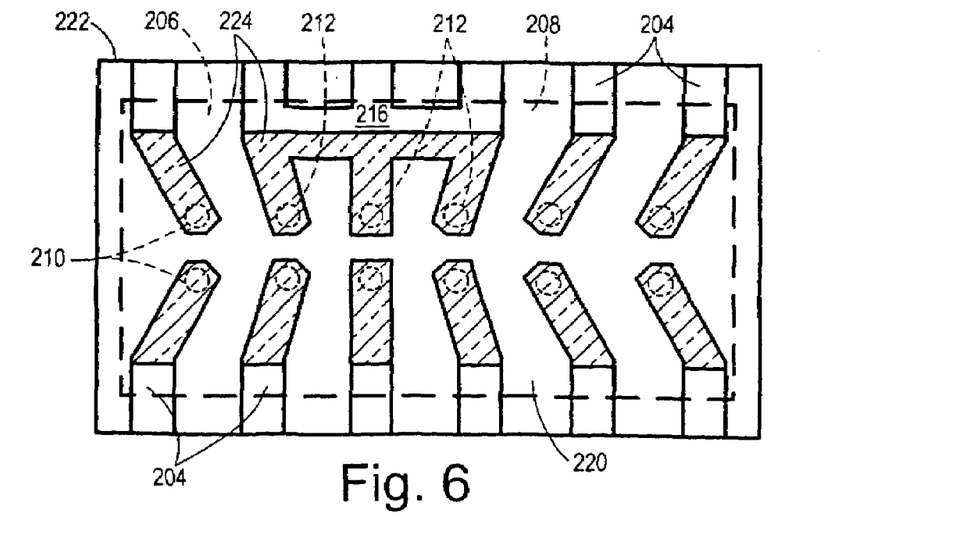
FIG. 6 is a bottom plan view of the package shown in FIGS. 4 and 5.

A second exemplary embodiment of a low-cost, thermally enhanced, chip-scale, LOC semiconductor package 200 in accordance with the present invention is illustrated in the top plan, cross-sectional side elevation, and bottom plan views of FIGS. 4–6, respectively, wherein elements that are the same or substantially similar to those in the first embodiment 100 are referenced with the same reference numbers, but incremented by 100.

Those of skill in the art will recognize the configuration of the semiconductor chip 206 in the second package 200 as that of a Dynamic Random Access Memory ("DRAM") chip of a known type, i.e., one in which signal connection pads 210, and the ground and power connection pads 212 on the active surface 208 thereof are disposed in two, parallel rows adjacent to a centerline of the chip. In accordance with the present invention, three power ($V_{cc}$) connection pads 212 are located adjacent to one another in the central region of the active surface 208 of the chip 206, and three correspondingly positioned power lands have been combined into a single, large power land 216 in the substrate 202 for enhanced heat dissipation from the chip through the lower surface 220 of the package 200 to the environment.

As in the first embodiment of package 100, an MLF version of the second embodiment 200 can apply a "half-etching" technique to the lower surface of the end portions 224 of the lead fingers 204 (shown cross-hatched in FIGS. 5 and 6) to reduce their thickness and permit the fingers to be spaced apart from each other at a distance that is less than the thickness of the MLF substrate 202. Alternatively, the MLF can be conventionally die-stamped.

By now, those of skill in the art will appreciate that many variations and modifications are possible in the present invention in terms of the materials and methods thereof without departing from its spirit and scope. For example, although an exemplary DRAM device has been described herein, this invention has advantageous application to other types of electronic devices as well, e.g., certain power devices, such as a power amplifier, and certain radio frequency ("RF") devices, where lead length is critical, such as in certain types of oscillators. Accordingly, the scope of this invention should not be limited to that of the particular embodiments described and illustrated herein, as these are merely exemplary in nature, but instead, should be commensurate with that of the claims appended hereafter and their functional equivalents.

What is claimed is:

1. A method of fabricating a semiconductor package, comprising the steps of:
   a) providing a substrate which has at least one land defining opposed top and bottom land surfaces, and a plurality of lead fingers disposed in spaced relation to the land, each of the lead fingers defining opposed top and bottom lead surfaces and an outer end;
   b) providing a semiconductor chip which has an active surface defining a central region and a peripheral region, and a plurality of connection pads disposed on the central and peripheral regions of the active surface;
   c) attaching the semiconductor chip to the substrate such that at least one of the connection pads is positioned over and in electrical communication with the land, and at least one of the connection pads is positioned over and in electrical communication with at least one of the lead fingers; and
   d) at least partially encapsulating the substrate and the semiconductor chip with a package body such that the bottom lead surfaces of the lead fingers are each substantially flush with a bottom surface of the body, and the outer end of each of the lead fingers is substantially flush with a respective one of multiple side surfaces defined by the body.

2. The method of claim 1 wherein step (a) comprises providing a substrate wherein at least one of the lead fingers is electrically connected to the land.

3. The method of claim 1 wherein step (b) comprises providing a semiconductor chip wherein at least one of the connection pads comprises a ground pad and at least one of the connection pads comprises a signal pad.

4. The method of claim 1 wherein step (b) comprises providing a semiconductor chip wherein at least one of the connection pads comprises a power pad and at least one of the connection pads comprises a signal pad.

5. The method of claim 1 wherein step (a) comprises providing a substrate wherein each of the lead fingers and the land are formed to include a recessed shoulder therein.

6. A method of fabricating a semiconductor package, comprising the steps of:
   a) providing a substrate which has first and second lands disposed in spaced relation to each other and a plurality of lead fingers disposed in spaced relation to the first and second lands, the first land defining opposed top and bottom first land surfaces, the second land defining opposed top and bottom second land surfaces, and each of the lead fingers defining opposed top and bottom lead surfaces;

b) providing a semiconductor chip which has an active surface defining a central region and a peripheral region, and a plurality of connection pads disposed on the central and peripheral regions of the active surface;

c) attaching the semiconductor chip to the substrate such that at least one of the connection pads is positioned over and electrically connected to the first land, at least one of the connection pads is positioned over and electrically connected to the second land, and at least one of the connection pads is positioned over and electrically connected to at least one of the lead fingers; and d) at least partially encapsulating the substrate and the semiconductor chip with a package body such that the bottom lead surfaces of the lead fingers are each substantially flush with a bottom surface of the body.

7. The method of claim 6 wherein step (a) comprises providing a substrate wherein at least two of the lead fingers are electrically connected to respective ones of the first and second lands.

8. The method of claim 6 wherein step (b) comprises providing a semiconductor chip wherein at least one of the connection pads comprises a ground pad, at least one of the connection pads comprises a power pad, and at least one of the connection pads comprises a signal pad.

9. The method of claim 6 wherein step (a) comprises providing a substrate wherein each of the lead fingers, the first land, and the second land are formed to include a recessed shoulder therein.

10. The method of claim 6 wherein:
step (a) comprises providing a substrate wherein each of the lead fingers defines an outer end; and
step (d) comprises configuring the package body such that the outer end of each of the leads is substantially flush with a respective one of multiple side surfaces defined by the package body.

11. A method of fabricating a semiconductor package, comprising the steps of:
a) providing a substrate which has a land and a plurality of lead fingers disposed proximate to the land, the land defining opposed top and bottom land surfaces and a plurality of land fingers, and each of the lead fingers defining opposed top and bottom lead surfaces and an outer end;

b) providing a semiconductor chip which has an active surface and a plurality of connection pads which extend along the active surface in spaced, generally parallel rows;

c) attaching the semiconductor chip to the substrate such that at least one of the connection pads is positioned over and electrically connected to at least one of the land fingers, and at least one of the connection pads is positioned over and electrically connected to at least one of the lead fingers;

d) at least partially encapsulating the substrate and the semiconductor chip with a package body such that the bottom lead surfaces of the lead fingers are each substantially flush with a bottom surface of the body.

12. The method of claim 11 wherein step (a) comprises providing a substrate wherein at least one of the lead fingers is electrically connected to the land.

13. The method of claim 11 wherein step (b) comprises providing a semiconductor chip wherein at least one of the connection pads comprises a ground pad, at least one of the connection pads comprises a power pad, and at least one of the connection pads comprises a signal pad.

14. The method of claim 11 wherein step (b) comprises providing a semiconductor chip wherein at least one of the connection pads comprises a ground pad, and at least one of the connection pads comprises a signal pad.

15. The method of claim 11 wherein step (b) comprises providing a semiconductor chip wherein at least one of the connection pads comprises a power pad, and at least one of the connection pads comprises a signal pad.

16. The method of claim 11 wherein step (a) comprises providing a substrate wherein each of the lead fingers and the land are formed to include a recessed shoulder therein.

17. The method of claim 11 wherein:
step (a) comprises providing a substrate wherein each of the lead fingers defines an outer end; and
step (d) comprises configuring the package body such that the outer end of each of the leads is substantially flush with a respective one of multiple side surfaces defined by the package body.

* * * * *